United States Patent
Han

(10) Patent No.: US 10,191,809 B2
(45) Date of Patent: Jan. 29, 2019

(54) CONVERTING A DATA CHUNK INTO A RING ALGEBRAIC STRUCTURE FOR FAST ERASURE CODING

(71) Applicant: International Business Machines Corporation, Armonk, NY (US)

(72) Inventor: Zhenxing Han, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 15/239,630

(22) Filed: Aug. 17, 2016

(65) Prior Publication Data

US 2018/0052737 A1 Feb. 22, 2018

(51) Int. Cl.
| | |
|---|---|
| *G06F 11/10* | (2006.01) |
| *G06F 11/14* | (2006.01) |
| *H03M 13/15* | (2006.01) |
| *G06F 9/30* | (2018.01) |
| *G06F 17/10* | (2006.01) |

(52) U.S. Cl.
CPC ...... *G06F 11/1096* (2013.01); *G06F 9/30029* (2013.01); *G06F 11/1446* (2013.01); *G06F 17/10* (2013.01); *H03M 13/15* (2013.01); *G06F 2201/84* (2013.01)

(58) Field of Classification Search
CPC .................................................. H04L 1/0009
USPC ................................. 714/774, 776
See application file for complete search history.

(56) References Cited

U.S. PATENT DOCUMENTS

| | | | |
|---|---|---|---|
| 7,240,236 B2* | 7/2007 | Cutts | G06F 11/1076 714/6.1 |
| 8,977,660 B1* | 3/2015 | Xin | H04N 21/23103 707/747 |
| 2010/0218037 A1 | 8/2010 | Swartz et al. | |
| 2013/0198583 A1 | 8/2013 | Shen et al. | |
| 2013/0339818 A1* | 12/2013 | Baker | G06F 11/10 714/763 |
| 2015/0012796 A1 | 1/2015 | Anderson et al. | |
| 2015/0100860 A1 | 4/2015 | Lee et al. | |
| 2015/0220392 A1 | 8/2015 | Jin et al. | |
| 2015/0347231 A1 | 12/2015 | Gopal et al. | |
| 2016/0182088 A1* | 6/2016 | Sipos | G06F 3/064 714/764 |
| 2017/0177266 A1* | 6/2017 | Doerner | G06F 3/0641 |

OTHER PUBLICATIONS

Quintin, G., et al., "On Generalized Reed-Solomon Codes Over Commutative and Noncommutative Rings", IEEE transactions on information theory, Sep. 2013, pp. 5882-5897, vol. 59, No. 9, United States.

(Continued)

*Primary Examiner* — Fritz Alphonse
(74) *Attorney, Agent, or Firm* — Sherman IP LLP; Kenneth L. Sherman; Hemavathy Perumal

(57) ABSTRACT

One embodiment provides a method comprising arranging a first data chunk into a ring structure, tagging the first data chunk by appending extra data to the first data chunk, and performing erasure coding on the first data chunk utilizing only exclusive or (XOR) operations.

20 Claims, 9 Drawing Sheets

(56) References Cited

OTHER PUBLICATIONS

Song et al., "Verification scheme of retrievability supporting XOR rotated erasure codes for cloud storage data", Journal of Chongqing University of Posts and Telecommunication, Dec. 2012, pp. 682-707, vol. 24, No. 6, China Academic Journal Electronic Publishing House, China [English-Language Abstract Only].
Plank, J.S., et al., "Screaming Fast Galois Field Arithmetic Using Intel SIMD Instructions", 11th USENIX Conference on File and Storage Technologies, Feb. 2013, pp. 1-9, United States.
Blaum, M., et al., "New array codes for multiple phased burst correction", IEEE Transactions on Information Theory, Jan. 1993, pp. 66-77, IEEE, United States [Abstract Only].
Blaum, M., et al., "EVENODD: An Efficient Scheme for Tolerating Double Disk Failures in RAID Architectures", IEEE Transactions on Computers, Feb. 1995, pp. 192-202, IEEE, United States.
List of IBM Patents or Patent Applications Treated as Related Form: Han, Z., U.S. Appl. No. 16/204,928, filed Nov. 29, 2018.

\* cited by examiner

CONVERTING A DATA CHUNK INTO A
RING ALGEBRAIC STRUCTURE FOR FAST
ERASURE CODING

The present invention generally relates to storage systems, and more particularly, to a system and method for converting a data chunk into a ring algebraic structure for fast erasure coding.

BACKGROUND

A cloud storage system may have requirements, such as increased recovery performance, increased reliability (i.e., increased data redundancy) and decreased storage overhead (i.e., increased storage efficiency). An example conventional storage system may utilize an erasure code, such as the redundant array of inexpensive disks (RAID) 6 and its variants, that is not very efficient, trading recovery performance for storage overhead and/or reliability. Another example conventional storage system may utilize a replication technique (e.g., three-way replication) that is slow and inefficient, trading recovery performance for storage overhead and/or reliability.

SUMMARY

One embodiment provides a method comprising arranging a first data chunk into a ring structure, tagging the first data chunk by appending extra data to the first data chunk, and performing erasure coding on the first data chunk utilizing only exclusive or (XOR) operations.

These and other aspects, features and advantages of the invention will be understood with reference to the drawing figures, and detailed description herein, and will be realized by means of the various elements and combinations particularly pointed out in the appended claims. It is to be understood that both the foregoing general description and the following brief description of the drawings and detailed description of the invention are exemplary and explanatory of preferred embodiments of the invention, and are not restrictive of the invention, as claimed.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

In this specification, let the term "data chunk" denote a chunk of data.

The present invention generally relates to storage systems, and more particularly, to a system and method for converting a data chunk into a ring algebraic structure for fast erasure coding. One embodiment provides a method comprising arranging a first data chunk into a ring structure, tagging the first data chunk by appending extra data to the first data chunk, and performing erasure coding on the first data chunk utilizing only exclusive or (XOR) operations.

A conventional storage system may utilize an erasure code, such as Reed-Solomon coding. Reed-Solomon coding, however, is inefficient as it involves multiplication of data, a time-consuming operation. Typically, multiplication of data may be implemented using either a table lookup operation or an XOR operation.

Embodiments of the invention provide a system and method for converting a data chunk into a ring algebraic structure for fast erasure coding. One embodiment arranges a large data chunk into a ring algebraic structure, and appends a fixed length of extra data to the data chunk. Appending the extra data to the data chunk allows the data chunk to be treated as a single code in the ring algebraic structure. Utilizing the ring algebraic structure allows for multiplication of data to be replaced with rotation of data instead. Compared to multiplication of data, rotation of data may be implemented simply and cheaply utilizing a pointer, thereby increasing efficiency. The ring algebraic structure simplifies the costly operation of multiplication by $x^n$ in Reed-Solomon like coding to just pointer movement.

The present invention may also be used in communication systems to facilitate encoding/decoding.

Figure 1:
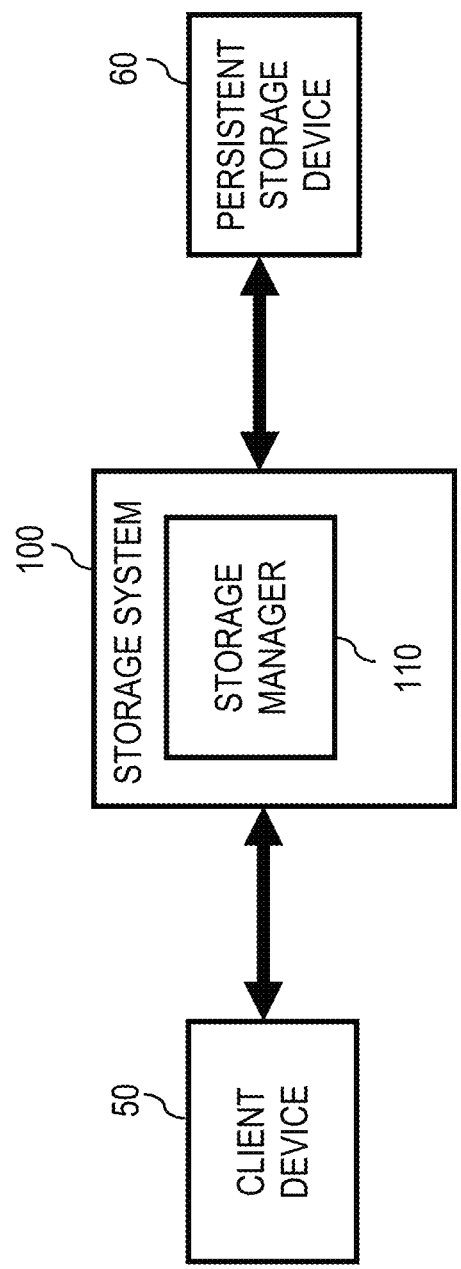
FIG. 1 illustrates an example storage system that facilitates fast erasure coding, in accordance with an embodiment of the invention.

FIG. 1 illustrates an example storage system 100 that facilitates fast erasure coding, in accordance with an embodiment of the invention. The storage system 100 comprises a storage manager 110 configured to: (1) receive unprocessed incoming data, (2) convert the incoming data into a ring structure, (3) perform erasure encoding (e.g., fast erasure encoding) on the incoming data utilizing the ring structure, and (4) write erasure code encoded data resulting from the encoding to a persistent storage device 60. Data written to the storage device 60 may be encoded with an erasure code, such as Reed-Solomon coding.

An electronic client device 50 (e.g., a personal computer or a mobile device such as a laptop computer, a tablet, a mobile phone, etc.) exchanges data with the storage system 100 over a connection (e.g., a wireless connection, a wired connection, or a combination of the two). The storage manager 110 is further configured to: (1) receive a request for a piece of data from the client device 50, (2) retrieve data with known erasures from the storage device 60 based on the request received, (3) perform erasure decoding (e.g., fast erasure decoding) on the data retrieved, and (4) return original data recovered from the decoding to the client device 50.

The storage system 100 may be implemented on a single electronic device (e.g., a server) or as a distributed computing environment. The storage device 60 may comprise a single storage unit or a distribution of storage units.

Figure 2:
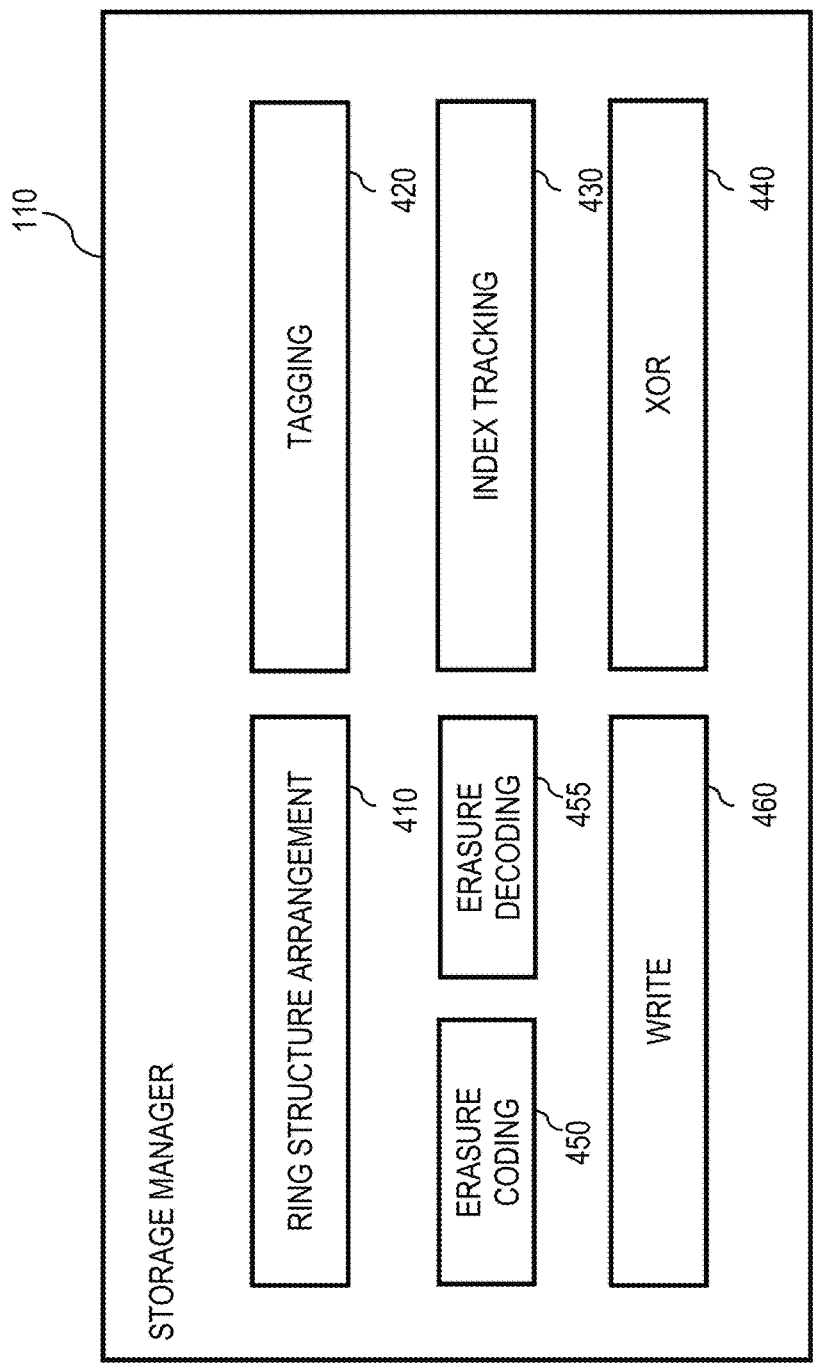
FIG. 2 illustrates a storage manager of the storage system, in accordance with an embodiment of the invention.

FIG. 2 illustrates the storage manager 110 in detail, in accordance with an embodiment of the invention. The storage manager 110 comprises a ring structure arrangement unit 410 configured to arrange unprocessed incoming data into a ring structure. In one embodiment, the ring structure is mathematically a ring algebraic structure comprising binary polynomials that satisfy three conditions. The first condition is that in such a ring algebraic structure, the highest degree of any polynomial in the ring algebraic structure is p−2, wherein p is a prime number. Any binary polynomial that has highest degree of p−1 may be written as form (1) provided below:

$$c_0 + c_1 x + c_2 x^2 + \ldots + c_{p-2} x^{p-2} + c_{p-1} x^{p-1} \qquad (1),$$

wherein $c_n$ is the coefficient of the $n^{th}$ degree, wherein $c_n$ is either 0 or 1 (as the polynomial is binary), and wherein the polynomial is in the ring algebraic structure if $c_{p-1} = 0$.

The second condition is that in such a ring algebraic structure, addition is implemented by regular binary addition (i.e., XOR) of polynomials.

The third condition is that in such a ring algebraic structure, a product resulting from multiplication of polynomials is taken modulo over a polynomial (2) provided below:

$$1 + x + x^2 + \ldots + x^{p-2} + x^{p-1} \qquad (2),$$

wherein the polynomial (2) is a zero element in the ring algebraic structure. As such, in the ring algebraic structure, any polynomial of the form (1) when added with polynomial (2) is itself; this property may be formally expressed by equation (3) provided below:

$$c_0 + c_1 x + c_2 x^2 + \ldots + c_{p-2} x^{p-2} + c_{p-1} x^{p-1} = c_0 \oplus 1 + (c_1 \oplus 1) x + (c_2 \oplus 1) x^2 + \ldots + (c_{p-2} \oplus 1) x^{p-2} + (c_{p-1} \oplus 1) x^{p-1} \qquad (3).$$

As a corollary to equation (3), given a polynomial of the form (1), XORing each coefficient with $c_{p-1}$ results in a polynomial that has highest degree of p−2; this property may be formally expressed by equation (4) provided below:

$$c_0 + c_1 x + c_2 x^2 + \ldots + c_{p-2} x^{p-2} + c_{p-1} x^{p-1} = c_0 \oplus c_{p-1} + (c_1 \oplus c_{p-1}) x + (c_2 \oplus c_{p-1}) x^2 + \ldots + (c_{p-2} \oplus c_{p-1}) x^{p-2} + (c_{p-1} \oplus c_{p-1}) x^{p-1} = c_0 \oplus c_{p-1} + (c_1 \oplus c_{p-1}) x + (c_2 \oplus c_{p-1}) x^2 + \ldots + (c_{p-2} \oplus c_{p-1}) x^{p-2} \qquad (4).$$

[Mathematical proof of equation (4) is as follows: We know $c_{p-1} \oplus c_{p-1} \equiv 0$. If $c_{p-1} = 0$, equation (4) is trivial. If $c_{p-1} = 1$, equation (4) is satisfied by equation (3). Q.E.D.]

The ring algebraic structure has two special properties. The first special property is that in such a ring algebraic structure, an operation involving multiplication of any polynomial by $x^n$ may be simplified to a rotation of coefficients; this operation may be formally expressed by equation (5) provided below:

$$(c_0 + c_1 x + c_2 x^2 + \ldots + c_{p-2} x^{p-2} + c_{p-1} x^{p-1}) \cdot x^n = c_{(-n) \bmod p} + c_{(1-n) \bmod p} x + c_{(2-n) \bmod p} x^2 + \ldots + c_{(p-n-2) \bmod p} x^{p-2} + c_{(p-n-1) \bmod p} x^{p-1} \qquad (5).$$

Table 1 below provides a visual representation of multiplication of any polynomial by $x^n$, wherein n=2.

TABLE 1

| Original Polynomial | Resulting Polynomial |
|---|---|
| $c_{p-1} x^{p-1}$ | $c_{p-3} x^{p-1}$ |
| $c_{p-2} x^{p-2}$ | ... |
| ... | $c_1 x^3$ |
| $c_2 x^2$ | $c_0 x^2$ |
| $c_1 x^1$ | $c_{p-1} x^1$ |
| $c_0 x^0$ | $c_{p-2} x^0$ |

Table 1 comprises the following: (1) a first column, wherein each entry of the first column represents an original polynomial, and (2) a second column, wherein each entry of the second column represents a polynomial resulting from multiplying the original polynomial by $x^2$. As shown by Table 1, multiplication of any polynomial by $x^2$ is simplified by rotation of coefficients (i.e., each coefficient is rotated up by 2 cells).

The second special property is that in such a ring algebraic structure, any polynomial in the ring algebraic structure may be divided by a polynomial of the form $1 + x^n$, wherein a result of the division is a polynomial in the ring algebraic structure.

The ring algebraic structure and its special properties as described above may be used to perform Reed-Solomon like erasure coding with increased efficiency.

For single instruction, multiple data (SIMD), the storage system 100 utilizes a 256-bit vector register that is 32 bytes in size. A size of a data chunk is determined in accordance with equation (6) provided below:

$$(p-1) \times 32 \qquad (6).$$

The arrangement unit 410 provides a logical arrangement for a data chunk as a matrix of bits. Let m denote a matrix of bits representing a logical arrangement for a data chunk. Let i denote a row of matrix m. Let j denote a column of matrix m. Let i, j denote an entry of matrix m at row i and column j.

The storage manager 110 further comprises a tagging unit 420 configured to append a fixed length of extra data to a data chunk. Appending extra data to a data chunk allows the data chunk to be treated as a single code in a ring algebraic structure.

The storage manager 110 further comprises an index tracking unit 430 configured to maintain an index tracking which row i of matrix m should be used to interpret a column j of matrix m.

The storage manager unit 110 further comprises an XOR unit 440 configured to perform an XOR operation of data.

The storage manager unit 110 further comprises an erasure encoding unit 450 configured to perform erasure encoding (e.g., fast erasure encoding) to obtain erasure code encoded data. As described in detail later herein, the ring algebraic structure simplifies an operation involving multiplication by $x^n$ in Reed-Solomon like coding to just pointer movement.

The storage manager unit 110 further comprises a write unit 460 configured to write erasure code encoded data to the storage device 60.

The storage manager unit 110 further comprises an erasure decoding unit 455 configured to perform erasure decoding (e.g., fast erasure decoding) on erasure code encoded data retrieved from the storage device 60.

Figure 3:
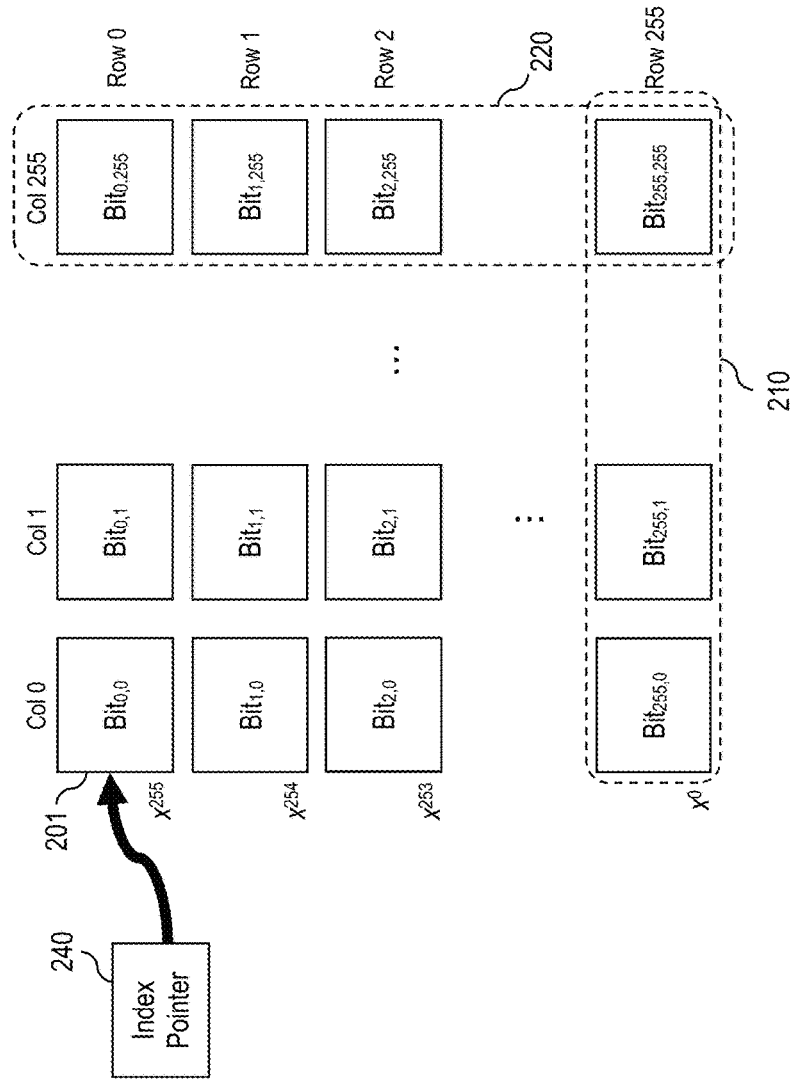
FIG. 3 illustrates an example logical data arrangement for a data chunk, in accordance with an embodiment of the invention.

FIG. 3 illustrates an example logical data arrangement for a data chunk 200, in accordance with an embodiment of the invention. The data chunk 200 comprises unprocessed incoming data. Assuming p=257, using equation (6) provided above, a size of the data chunk 200 is 8192 bytes. As shown in FIG. 3, the arrangement unit 410 provides a 256×256 matrix m of bits representing a logical data arrangement for the 8192-byte data chunk 200. Each entry i,j of matrix m comprises a bit 201 (e.g., $Bit_{0,0}$ at Row 0, Col 0). Each column 220 (e.g., Col 0, Col 1, ..., and Col 255) of matrix m corresponds to a polynomial of the form (1). There are 256 such polynomials in the data chunk 200. Each row 210 (e.g., Row 0, Row 1, ..., and Row 255) of matrix m represents a 256-bit SIMD vector that corresponds to the terms of the same degree from the 256 polynomials of the form (1).

For example, a first row 210 (Row 0) of matrix m corresponds to terms of $x^{255}$, a second row 210 (Row 1) of matrix m corresponds to terms of $x^{254}$, a third row 210 (Row 3) of matrix m corresponds to terms of $x^{253}$, ..., and a $256^{th}$ row 210 (Row 255) of matrix m corresponds to terms of $x^0$. Initially, all coefficients of term $x^{256}$ are zero; as such, matrix m only has 256 rows instead of 257 rows.

The index tracking unit 430 maintains an index pointer 240 that references/points to a row i of matrix m that corresponds to terms of a specific degree. In one embodiment, the index pointer 240 may reference/point to a row i of matrix m that corresponds to terms of $x^{255}$. For example, as shown in FIG. 3, the index pointer 240 is initially set to reference/point to the first row 210 (Row 0) of matrix m as the first row 210 corresponds to terms of $x^{255}$.

Figure 4A:
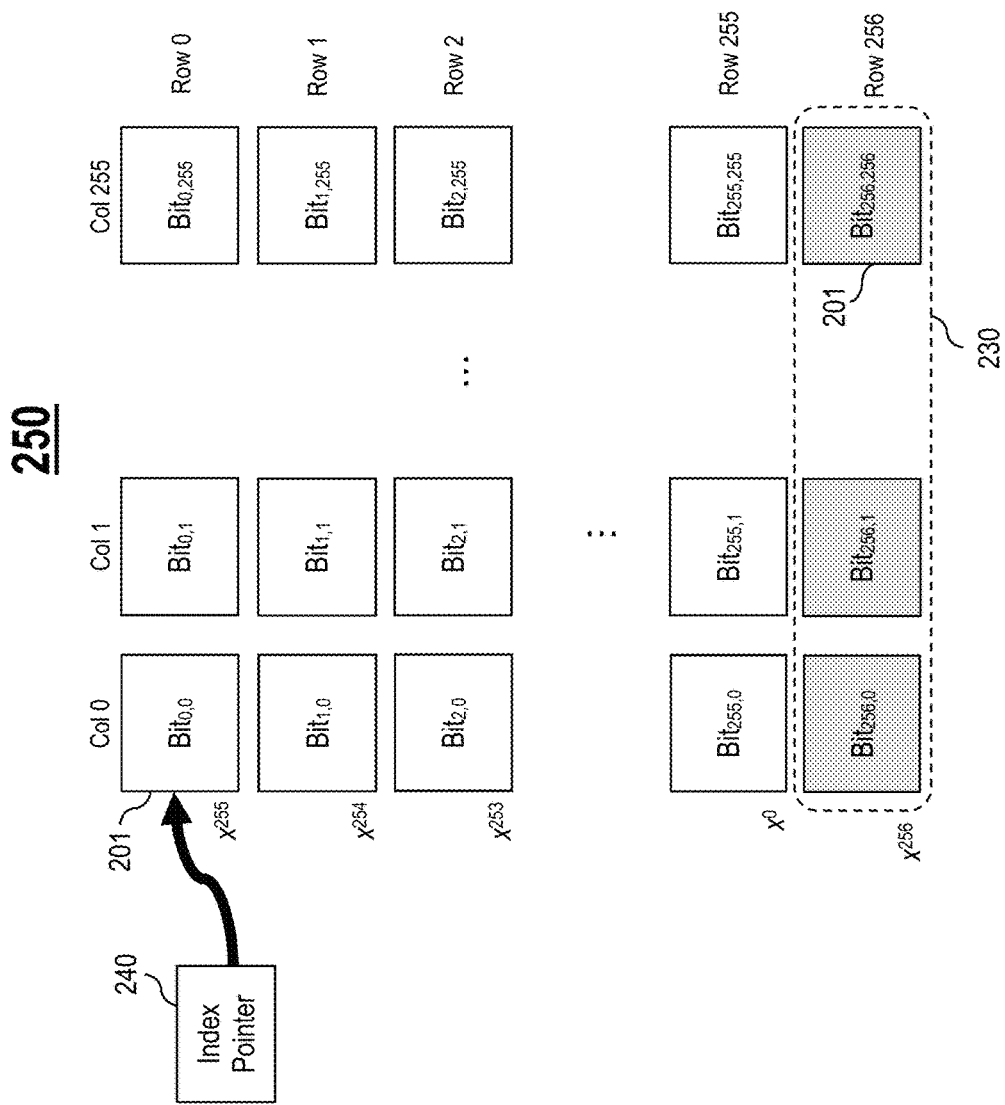
FIG. 4A illustrates an example tagged data chunk resulting from appending extra data to the data chunk in FIG. 3, in accordance with an embodiment of the invention.

FIG. 4A illustrates an example tagged data chunk 250 resulting from appending extra data to the data chunk 200 in FIG. 3, in accordance with an embodiment of the invention. The tagging unit 420 appends/tags an additional row 230 representing an additional 256-bit SIMD vector to matrix m for the data chunk 200 to obtain the tagged data chunk 250. Appending the additional row 230 to matrix m allows rotation of coefficients as illustrated in Table 1 above. Appending an additional row 230 representing coefficients of $x^{256}$ helps preserve coefficients of $x^{256}$ as zero (as coefficients of $x^{256}$ may become non-zero during erasure coding).

Figure 4B:
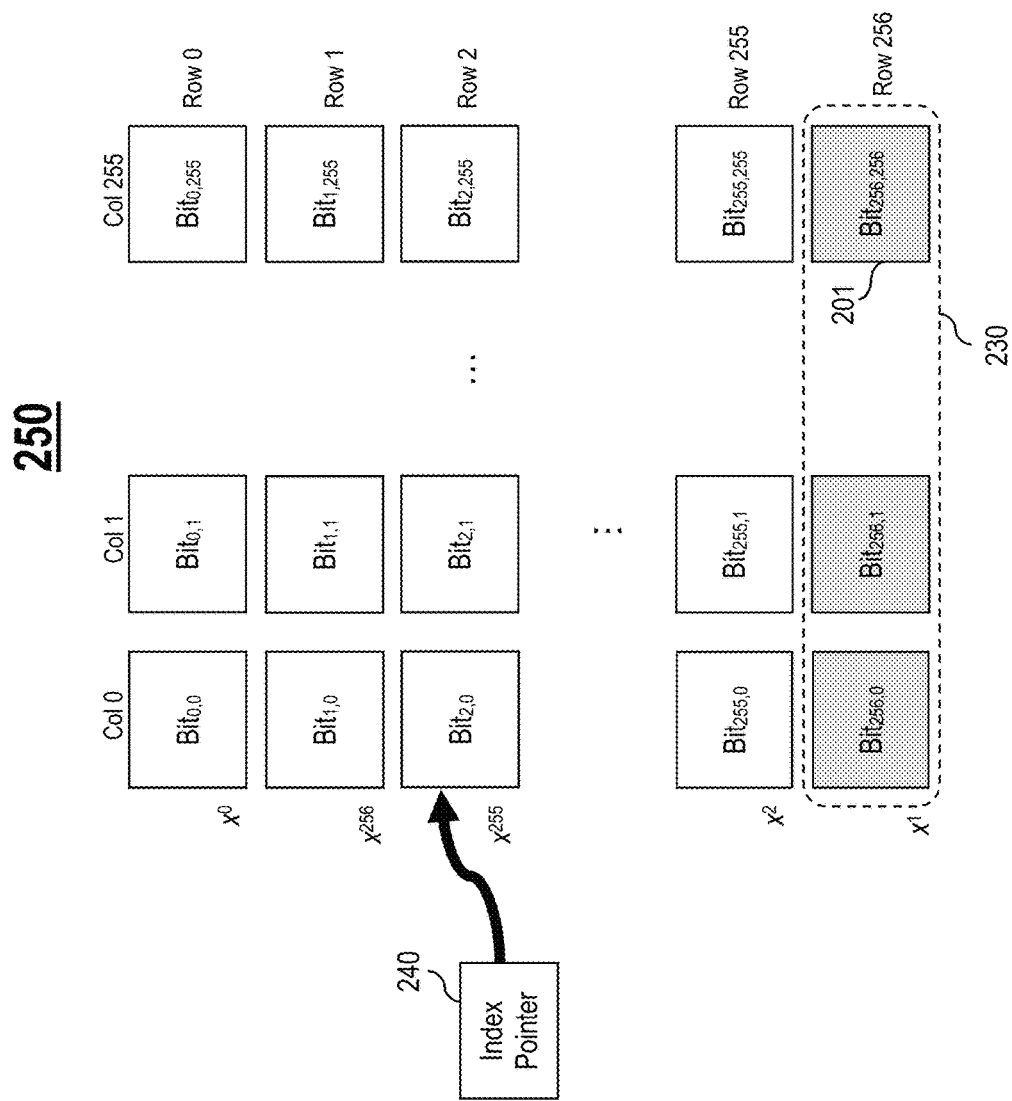
FIG. 4B illustrates pointer movement resulting from multiplication of the tagged data chunk in FIG. 4A by $x^2$, in accordance with an embodiment of the invention.

FIG. 4B illustrates pointer movement resulting from multiplication of the tagged data chunk 250 in FIG. 4A by $x^2$, in accordance with an embodiment of the invention. During erasure encoding, incoming data is expanded and encoded with redundant data pieces. Unlike the data chunk 200 in FIG. 3 that comprises unprocessed incoming data, the tagged data chunk 250 in FIG. 4B comprises processed data. For example, the tagged data chunk 250 may represent the incoming data multiplied by $x^n$, wherein n is an integer number.

To multiply data by $x^n$, an index pointer 240 for a data chunk comprising the data is offset by n rows (i.e., adjusted to reference/point to another row of matrix m that is located/positioned n rows below). For example, in FIG. 3, the index pointer 240 initially references/points to the first row 210 (Row 0) of matrix m that corresponds to terms of $x^{255}$. To multiply the incoming data by $x^2$, the index pointer 240 is adjusted, via the index tracking unit 430, such that the index pointer 240 now references/points to a third row 210 (Row 2) of matrix m that is located/positioned two (i.e., n=2) rows below the first row 210 (Row 0), as shown in FIG. 4B. The third row 210 (Row 2) of matrix m now corresponds to terms of $x^{255}$. FIG. 4B and Table 1 illustrate rotation of coefficients (i.e., each coefficient is rotated up by 2 cells).

Let $index_{old}$ denote an index value indicative of a row that the index pointer 240 is referencing/pointing to before the index pointer 240 is adjusted/offset (e.g., before the incoming data is multiplied by $x^n$). Let $index_{new}$ denote a new index value indicative of a row that the index pointer 240 will reference/point to after the index pointer 240 is adjusted/offset (e.g., after the incoming data is multiplied by $x^n$). In one embodiment, if the index pointer 240 is adjusted/offset to reference/point to a row located/positioned below the additional row 230, the index pointer 240 wraps around back to the first row 210 (Row 0) of matrix m. The new index value $index_{new}$ for an adjusted index pointer 240 may be represented in accordance with equation (7) provided below:

$$index_{new} = (index_{old} + n) \bmod p \quad (7).$$

Equation (7) is an example implementation of equation (5) and Table 1. For example, assuming $index_{old}$=255 and n=2, using equation (7) provided above, $index_{new}$=(255+2) mod 257=0, indicating that the index pointer 240 is adjusted/offset to reference/point to Row 0 of matrix m.

As each row i of matrix m for a data chunk represents a SIMD register, in a modern central processing unit (CPU), addition of data may be implemented using SIMD XOR instruction which is fast.

Let highest-term denote a row of matrix m that corresponds to terms of $x^{p-1}$. Row highest-term may be the additional row 230 appended to matrix m or any row 210 of matrix m. For example, as shown in FIG. 4B, row highest-term is the second row 210 (Row 1) of matrix m as the second row 210 (Row 1) corresponds to terms of $x^{256}$ (assuming p=257).

Figure 5:
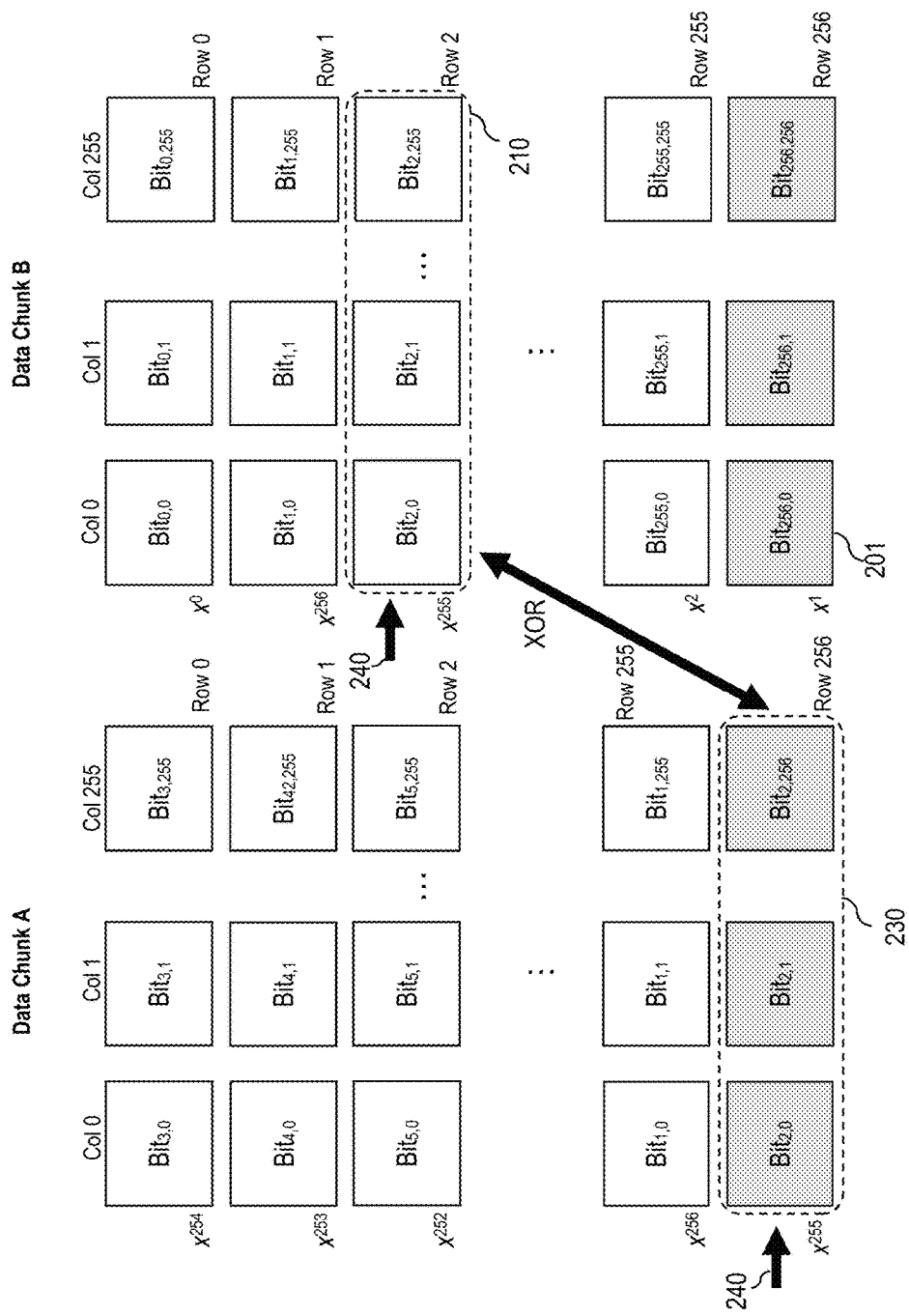
FIG. 5 illustrates addition of two different data chunks, in accordance with an embodiment of the invention.

FIG. 5 illustrates addition of two different data chunks, in accordance with an embodiment of the invention. Erasure encoding may involve the addition of two different data chunks. For example, as shown in FIG. 5, erasure encoding may involve the addition of the following: (1) a first tagged data chunk referenced as "Data Chunk A", and (2) a second tagged data chunk referenced as "Data Chunk B".

As shown in FIG. 5, Data Chunk A and Data Chunk B have different logical arrangements. Let $m_A$ denote a matrix representing a logical arrangement for Data Chunk A. Let $m_B$ denote a matrix representing a logical arrangement for Data Chunk B. Assume matrices $m_A$ and $m_B$ have the same dimensions (i.e., the same number of columns and the same number of rows). Let $i_A$ denote an index value indicative of a row of matrix $m_A$ that an index pointer 240 for Data Chunk A references/points to. Let $i_B$ denote an index value indicative of a row of matrix $m_B$ that an index pointer 240 for Data Chunk B references/points to.

Assuming p=257, the index pointer 240 for Data Chunk A references/points to Row 256 of matrix $m_A$ that corresponds to terms of $x^{255}$, as shown in FIG. 5. As the index pointer 240 for Data Chunk A is offset by 256 rows, $i_A$=256. Data Chunk A comprises data multiplied by $x^{256}$. For example, Data Chunk A may comprise incoming data a multiplied by $x^{256}$ (i.e., Data Chunk A comprises $ax^{256}$). The index pointer 240 for Data Chunk B references/points to Row 2 of matrix $m_B$ that corresponds to terms of $x^{255}$. As the index pointer 240 for Data Chunk B is offset by 2 rows, $i_B$=2. Data Chunk B comprises data multiplied by $x^2$. For example, Data Chunk B may comprise incoming data b multiplied by $x^2$ (i.e., Data Chunk B comprises $bx^2$).

To facilitate the addition of two different data chunks during erasure encoding, the XOR unit 440 may be utilized to XOR rows of the data chunks with proper offsets. Specifically, to facilitate the addition of Data Chunk A and Data Chunk B, each row of matrix $m_A$ is aligned with a row of matrix $m_B$ that corresponds to terms of the same degree. For example, as shown in FIG. 5, Row 256 of matrix $m_A$ that corresponds to terms of $x^{255}$ is aligned with Row 2 of matrix $m_B$ that also corresponds to terms of $x^{255}$. Each pair of aligned rows is then XOR'ed utilizing the XOR unit 440. For example, as shown in FIG. 5, aligned rows Row 256 of matrix $m_A$ and Row 2 of matrix $m_B$ are XOR'ed.

The addition of Data Chunk A and Data Chunk B may be summarized as follows: XOR $(i_A)^{th}$ row of matrix $m_A$ with $(i_B)^{th}$ row of matrix $m_B$ (i.e., Row 256 of matrix $m_A$ and Row 2 of matrix $m_B$ are XOR'ed), XOR $((i_A+1)$ modulo p$)^{th}$ row of matrix $m_A$ with $((i_B+1)$ modulo p$)^{th}$ row of matrix $m_B$ (i.e., Row 0 of matrix $m_A$ and Row 3 of matrix $m_B$ are XOR'ed), and so on until each row of matrix $m_A$ and a row of matrix $m_B$ that corresponds to terms of the same degree are XOR'ed.

Let "Data Chunk C" denote a third data chunk comprising erasure code encoded data resulting from the addition of Data Chunk A and Data Chunk B. Let $m_C$ denote a matrix representing a logical arrangement for Data Chunk C. Let highest-term$_C$ denote a row of matrix $m_C$ that corresponds to terms of $x^{p-1}$ or any x with a degree higher than p−1. During erasure coding, row highest-term$_C$ may be non-zero. Specifically, one or more bits 201 of row highest-term$_C$ may be changed to a non-zero value (i.e., coefficients of term $x^{256}$ may become non-zero during erasure coding). To satisfy the condition that the highest degree of any term in the ring algebraic structure must be p−2, row highest-term$_C$ must be restored to all-zero (i.e., all bits 201 of row highest-term$_C$ must be zeroed out) before Data Chunk C is written to the storage device 60. Specifically, row highest-term$_C$ is restored by XORing each row of Data Chunk C with row highest-term$_C$, in accordance with equation (4). For example, if row highest-term$_C$ is the last row of matrix $m_C$, all bits of the last row are zeroed out by XORing each row of matrix $m_C$ with the last row. After row highest-term$_C$ is restored to all-zero, Data Chunk C only has 256 useful rows instead of 257 useful rows (i.e., Data Chunk C has the same size/dimension as its original data chunks). The write unit 460 is utilized to write the 256 useful rows of matrix $m_C$ to the storage device 60 (i.e., row highest-term$_C$ is discarded).

Figure 6:
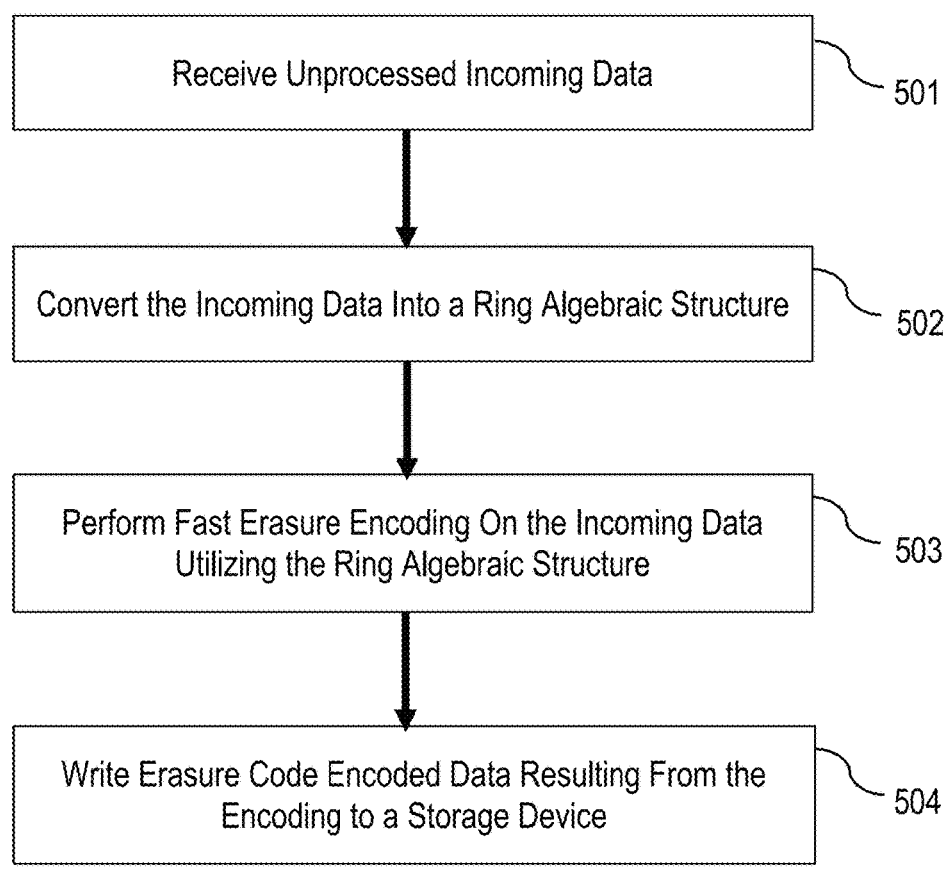
FIG. 6 illustrates a flowchart of an example process for encoding data, in accordance with an embodiment of the invention.

FIG. 6 illustrates a flowchart of an example process 500 for encoding data, in accordance with an embodiment of the invention. In process block 501, receive unprocessed incoming data. In process block 502, convert the incoming data into a ring algebraic structure. In process block 503, perform fast erasure encoding on the incoming data utilizing the ring algebraic structure. In process block 504, write erasure code encoded data resulting from the encoding to a storage device.

Figure 7:
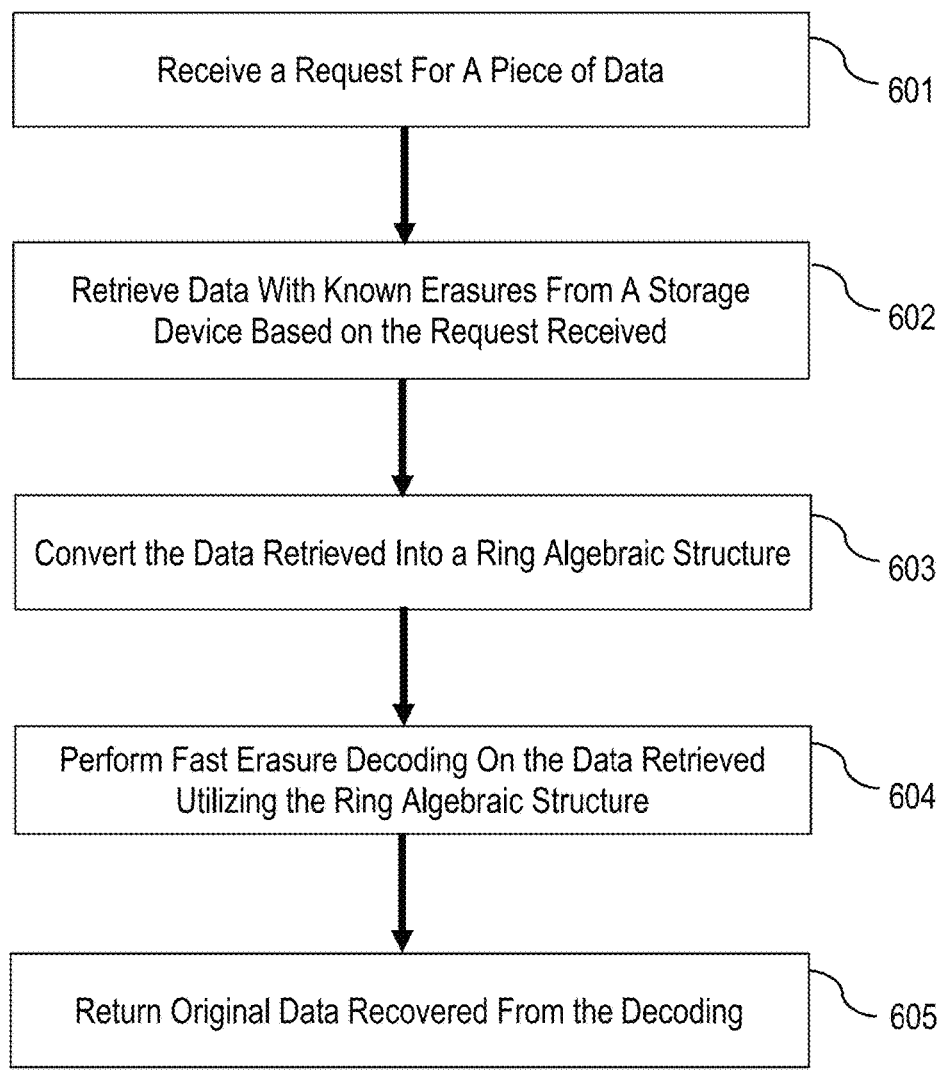
FIG. 7 illustrates a flowchart of an example process for decoding data, in accordance with an embodiment of the invention.

FIG. 7 illustrates a flowchart of an example process 600 for decoding data, in accordance with an embodiment of the invention. In process block 601, receive a request for a piece of data. In process block 602, retrieve data with known erasures from a storage device based on the request received. In process block 603, convert the data retrieved into a ring algebraic structure. In process block 604, perform fast erasure decoding on the data retrieved utilizing the ring algebraic structure. In process block 605, return original data recovered from the decoding.

In one embodiment, during erasure coding, every 36 original data chunks will have 4 extra coded data chunks (i.e., parities) as protection. The 4 extra coded data chunks are the result of linear operations (addition and multiplication) of the 36 original data chunks. The 4 extra coded data chunks are stored in storage device 60 in the same dimensions as the 36 original data chunks (e.g., each extra coded data chunk and each original data chunk is a 8192-byte data chunk; each extra coded data chunk and each original data chunk is logically a 256×256 matrix of bits). During encoding, the 4 extra coded data chunks are treated as all-zero (erasures). Encoding the 4 extra coded data chunks is just like decoding the 4 extra coded data chunks (i.e., during decoding, an additional row 230 is appended to the 4 extra coded data chunks).

Figure 8:
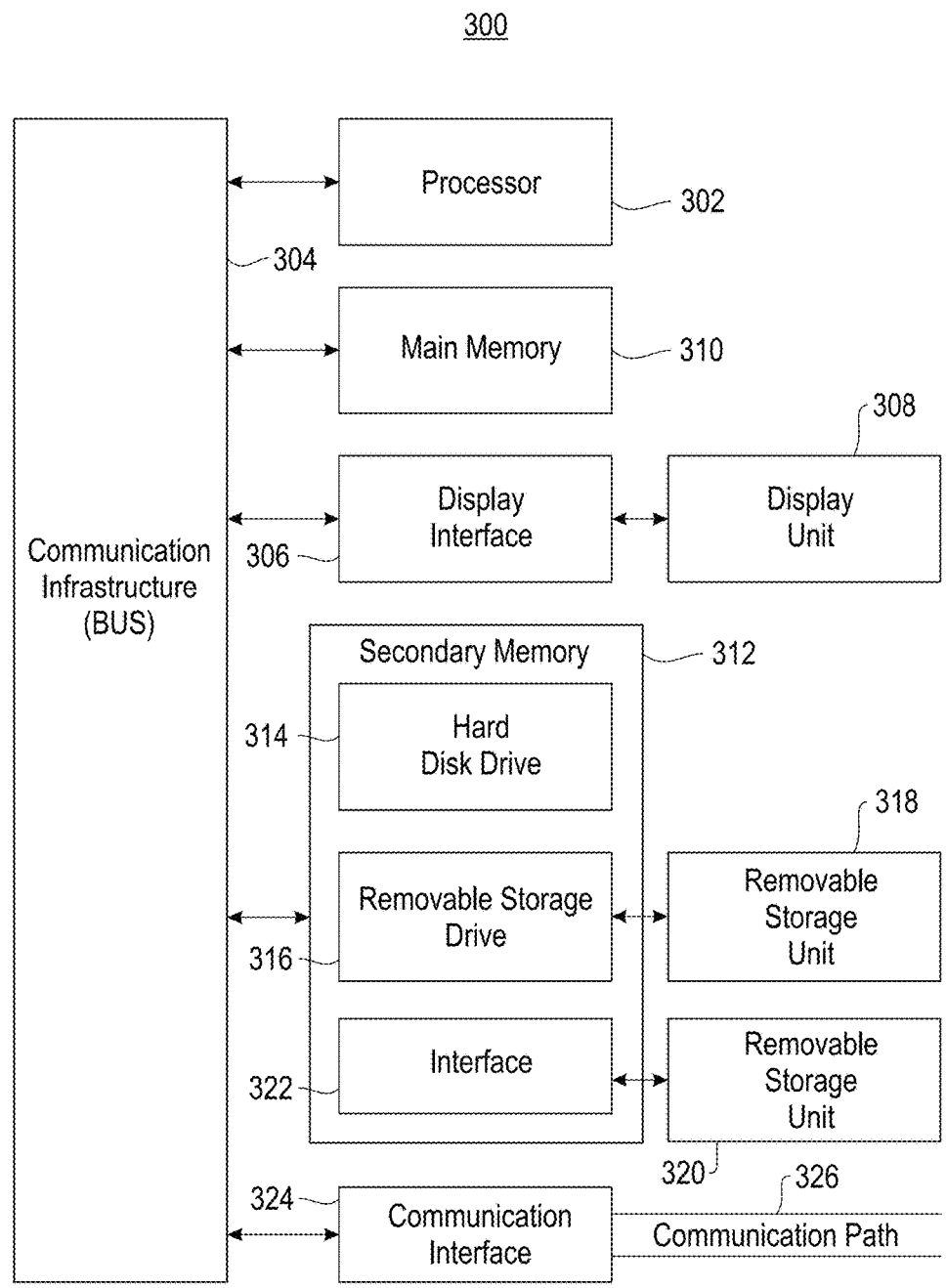
FIG. 8 is a high level block diagram showing an information processing system useful for implementing an embodiment of the present invention.

FIG. 8 is a high level block diagram showing an information processing system 300 useful for implementing one embodiment of the invention. The computer system includes one or more processors, such as processor 302. The processor 302 is connected to a communication infrastructure 304 (e.g., a communications bus, cross-over bar, or network).

The computer system can include a display interface 306 that forwards graphics, text, and other data from the communication infrastructure 304 (or from a frame buffer not shown) for display on a display unit 308. The computer system also includes a main memory 310, preferably random access memory (RAM), and may also include a secondary memory 312. The secondary memory 312 may include, for example, a hard disk drive 314 and/or a removable storage drive 316, representing, for example, a floppy disk drive, a magnetic tape drive, or an optical disk drive. The removable storage drive 316 reads from and/or writes to a removable storage unit 318 in a manner well known to those having ordinary skill in the art. Removable storage unit 318 represents, for example, a floppy disk, a compact disc, a magnetic tape, or an optical disk, etc. which is read by and written to by removable storage drive 316. As will be appreciated, the removable storage unit 318 includes a computer readable medium having stored therein computer software and/or data.

In alternative embodiments, the secondary memory 312 may include other similar means for allowing computer programs or other instructions to be loaded into the computer system. Such means may include, for example, a removable storage unit 320 and an interface 322. Examples of such means may include a program package and package interface (such as that found in video game devices), a removable memory chip (such as an EPROM, or PROM) and associated socket, and other removable storage units 320 and interfaces 322, which allows software and data to be transferred from the removable storage unit 320 to the computer system.

The computer system may also include a communication interface 324. Communication interface 324 allows software and data to be transferred between the computer system and external devices. Examples of communication interface 324 may include a modem, a network interface (such as an Ethernet card), a communication port, or a PCMCIA slot and card, etc. Software and data transferred via communication interface 324 are in the form of signals which may be, for example, electronic, electromagnetic, optical, or other signals capable of being received by communication interface 324. These signals are provided to communication interface 324 via a communication path (i.e., channel) 326. This communication path 326 carries signals and may be implemented using wire or cable, fiber optics, a phone line, a cellular phone link, an RF link, and/or other communication channels.

The present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

From the above description, it can be seen that the present invention provides a system, computer program product, and method for implementing the embodiments of the invention. The present invention further provides a non-transitory computer-useable storage medium for implementing the embodiments of the invention. The non-transitory computer-useable storage medium has a computer-readable program, wherein the program upon being processed on a computer causes the computer to implement the steps of the present invention according to the embodiments described herein. References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
    at a storage manager of a storage system:
        arranging a first data chunk into a ring structure;
        tagging the first data chunk by appending extra data to the ring structure;
        performing erasure coding on the first data chunk utilizing only exclusive or (XOR) operations and the ring structure, wherein erasure coded encoded data resulting from the erasure coding is written to a persistent storage device; and
        maintaining an index pointer that references a portion of the ring structure;
        wherein the ring structure allows for multiplication of data included in the first data chunk to be implemented by rotation of the data utilizing the index pointer, thereby increasing efficiency of the storage system as the multiplication is simplified to an adjustment of the index pointer.

2. The method of claim 1, wherein:
    the ring structure is a ring algebraic structure comprising binary polynomials;
    the highest degree of any term in the ring algebraic structure is p−2, wherein p is a prime number;
    the ring algebraic structure supports addition of polynomials, and the addition of polynomials is implemented via an XOR operation; and
    the ring algebraic structure supports multiplication of polynomials, and a product resulting from the multiplication of polynomials is taken modulo over a polynomial expression.

3. The method of claim 2, wherein:
    a logical data arrangement for the first data chunk comprises a first matrix of bits;
    each column of the first matrix corresponds to a polynomial; and
    each row of the first matrix represents a single instruction, multiple data (SIMD) vector that corresponds to terms of the same degree in the polynomials.

4. The method of claim 3, wherein the tagging comprises appending an additional row of bits representing an additional SIMD vector to the first matrix.

5. The method of claim 4, wherein the index pointer references a row of the first matrix, and the row corresponds to terms of a specific degree.

6. The method of claim 5, further comprising:
    at the storage manager of the storage system:
        multiplying data included in the data chunk by adjusting the index pointer to reference another row of the first matrix, wherein the total number of rows the index pointer is offset by is indicative of an amount by which the data is multiplied by.

7. The method of claim 4, wherein the performing erasure coding comprises performing an addition of the first data chunk and a second data chunk.

8. The method of claim 7, wherein:
    a logical data arrangement for the second data chunk comprises a second matrix of bits; and
    the performing an addition comprises:
        aligning each row of the first matrix with a row of the second matrix that corresponds to terms of the same degree; and
        for each pair of aligned rows, performing an XOR operation of the aligned rows.

9. The method of claim 8, further comprising:
    at the storage manager of the storage system:
        writing a third data chunk to a persistent storage device, wherein the third data chunk comprises erasure coded encoded data resulting from the addition of the first data chunk and the second data chunk.

10. The method of claim 9, wherein:
    a logical data arrangement for the third data chunk comprises a third matrix of bits; and
    a row of the third matrix that corresponds to terms having a degree greater than p−2 is zeroed out and discarded.

11. A storage system comprising:
    at least one processor; and
    a non-transitory processor-readable memory device storing instructions that when executed by the at least one processor causes the at least one processor to perform operations including:
        at a storage manager of the storage system:
            arranging a first data chunk into a ring structure;
            tagging the first data chunk by appending extra data to the ring structure;
            performing erasure coding on the first data chunk utilizing only exclusive or (XOR) operations and the ring structure, wherein erasure coded encoded data resulting from the erasure coding is written to a persistent storage device; and
            maintaining an index pointer that references a portion of the ring structure;
            wherein the ring structure allows for multiplication of data included in the first data chunk to be implemented by rotation of the data utilizing the index pointer, thereby increasing efficiency of the storage system as the multiplication is simplified to an adjustment of the index pointer.

12. The storage system of claim 11, wherein:
    the ring structure is a ring algebraic structure comprising binary polynomials;
    the highest degree of any term in the ring algebraic structure is p−2, wherein p is a prime number;

the ring algebraic structure supports addition of polynomials, and the addition of polynomials is implemented via an XOR operation; and the ring algebraic structure supports multiplication of polynomials, and a product resulting from the multiplication of polynomials is taken modulo over a polynomial expression.

13. The storage system of claim 12, wherein:

a logical data arrangement for the first data chunk comprises a first matrix of bits;

each column of the first matrix corresponds to a polynomial; and each row of the first matrix represents a single instruction, multiple data (SIMD) vector that corresponds to terms of the same degree in the polynomials.

14. The storage system of claim 13, wherein the tagging comprises appending an additional row of bits representing an additional SIMD vector to the first matrix.

15. The storage system of claim 14, wherein the index pointer references a row of the first matrix, and the row corresponds to terms of a specific degree.

16. The storage system of claim 15, wherein the operations further comprise:

at the storage manager of the storage system:
multiplying data included in the data chunk by adjusting the index pointer to reference another row of the first matrix, wherein the total number of rows the index pointer is offset by is indicative of an amount by which the data is multiplied by.

17. The storage system of claim 14, wherein the performing erasure coding comprises performing an addition of the first data chunk and a second data chunk.

18. The storage system of claim 17, wherein:

a logical data arrangement for the second data chunk comprises a second matrix of bits; and the performing an addition comprises:
aligning each row of the first matrix with a row of the second matrix that corresponds to terms of the same degree; and
for each pair of aligned rows, performing an XOR operation of the aligned rows.

19. The storage system of claim 18, wherein the operations further comprise:

at the storage manager of the storage system:
writing a third data chunk to a persistent storage device, wherein the third data chunk comprises erasure coded encoded data resulting from the addition of the first data chunk and the second data chunk.

20. A computer program product comprising a computer-readable hardware storage medium having program code embodied therewith, the program code being executable by a computer to implement a method comprising:

at a storage manager of a storage system:
arranging a first data chunk into a ring structure;
tagging the first data chunk by appending extra data to the first data chunk ring structure; and
performing erasure coding on the first data chunk utilizing only exclusive or (XOR) operations and the ring structure, wherein erasure coded encoded data resulting from the erasure coding is written to a persistent storage device; and
maintaining an index pointer that references a portion of the ring structure;
wherein the ring structure allows for multiplication of data included in the first data chunk to be implemented by rotation of the data utilizing the index pointer, thereby increasing efficiency of the storage system as the multiplication is simplified to an adjustment of the index pointer.

* * * * *